(12) United States Patent
Naijo

(10) Patent No.: US 8,169,034 B2
(45) Date of Patent: May 1, 2012

(54) SEMICONDUCTOR DEVICE

(75) Inventor: Tatsuo Naijo, Hyogo-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 229 days.

(21) Appl. No.: 12/723,338

(22) Filed: Mar. 12, 2010

(65) Prior Publication Data

US 2010/0230716 A1 Sep. 16, 2010

(30) Foreign Application Priority Data

Mar. 13, 2009 (JP) ................. 2009-060697

(51) Int. Cl.
*H01L 31/119* (2006.01)

(52) U.S. Cl. ........ 257/378; 257/330; 257/331; 257/334; 257/368; 257/E29.197

(58) Field of Classification Search .................. 257/368, 257/378, 330, 331, 334, E29.197
See application file for complete search history.

(56) References Cited

FOREIGN PATENT DOCUMENTS

| JP | 10-261704 | 9/1998 |
|---|---|---|
| JP | 2001-077357 | 3/2001 |
| JP | 2001-250947 | 9/2001 |
| JP | 2001-298190 | 10/2001 |
| JP | 2003-158131 | 5/2003 |
| JP | 2006-19556 A | 1/2006 |
| JP | 2007-288158 | 11/2007 |

OTHER PUBLICATIONS

Japanese Office Action dated Oct. 24, 2011, filed in Japanese counterpart Application No. 2009-060697, 8 pages (with English translation).

Office Action mailed Jul. 27, 2011, in Japanese counterpart Application No. 2009-060697 and translation, 8 pages.

*Primary Examiner* — Samuel Gebremariam
(74) *Attorney, Agent, or Firm* — Patterson & Sheridan, LLP

(57) ABSTRACT

A semiconductor device includes: a drift layer of a first conductivity type; a base layer of a second conductivity type provided on the drift layer; an emitter layer of the first conductivity type provided in part of an upper portion of the base layer; a buffer layer of the first conductivity type provided below the drift layer; a high-resistance layer of the first conductivity type provided below the buffer layer; a collector layer of the second conductivity type provided in a partial region on a lower surface of the high-resistance layer; a contact layer of the first conductivity type provided in another partial region on the lower surface of the high-resistance layer; a trench gate electrode extending through the emitter layer and the base layer into the drift layer; and a gate insulating film provided between the emitter layer, the base layer, and the drift layer on one hand and the trench gate electrode on the other.

16 Claims, 5 Drawing Sheets

SEMICONDUCTOR DEVICE

CROSS-REFERENCE TO RELATED APPLICATIONS

This application is based upon and claims the benefit of priority from the prior Japanese Patent Application No. 2009-60697, filed on Mar. 13, 2009; the entire contents of which are incorporated herein by reference.

BACKGROUND OF THE INVENTION

1. Field of the Invention

This invention relates to a bipolar semiconductor device for power control.

2. Background Art

Insulated gate bipolar transistors (IGBTs) have been conventionally used as semiconductor devices for power control. In recent years attention has been paid to an anode-shorted IGBT in which a P-type collector layer is partly formed on the lower surface of the chip. In an anode-shorted IGBT, the P-type collector layer is formed only in a partial region of the lower surface of the chip, and an N-type drift layer is exposed to the remaining region of the lower surface of the chip. Furthermore, the P-type collector layer and the N-type drift layer are both connected to the collector electrode. Thus, when the IGBT is turned off, electrons in the N-type drift layer can be rapidly ejected through the collector electrode, enabling the turn-off time to be reduced (see, e.g., JP-A-2006-019556).

However, in such an anode-shorted IGBT, unless the P-type collector layer has a higher potential than the N-type layer, the junction interface between the P-type collector layer and the N-type drift layer does not become a forward junction, and the IGBT fails to be turned on. Thus, unfortunately, the IGBT is difficult to turn on stably.

SUMMARY OF THE INVENTION

According to an aspect of the invention, there is provided a semiconductor device including: a drift layer of a first conductivity type; a base layer of a second conductivity type provided on the drift layer; an emitter layer of the first conductivity type provided in part of an upper portion of the base layer; a buffer layer of the first conductivity type provided below the drift layer and having a higher effective impurity concentration than the drift layer; a high-resistance layer of the first conductivity type provided below the buffer layer and having a higher resistivity than the buffer layer; a collector layer of the second conductivity type provided in a partial region on a lower surface of the high-resistance layer; a contact layer of the first conductivity type provided in another partial region on the lower surface of the high-resistance layer; an emitter electrode connected to the base layer and the emitter layer; a trench gate electrode extending through the emitter layer and the base layer into the drift layer; a gate insulating film provided between the emitter layer, the base layer, and the drift layer on one hand and the trench gate electrode on the other; and a collector electrode connected to the collector layer and the contact layer.

DETAILED DESCRIPTION

Embodiments of the invention will now be described with reference to the drawings.

At the outset, a first embodiment of the invention is described.

Figure 1:
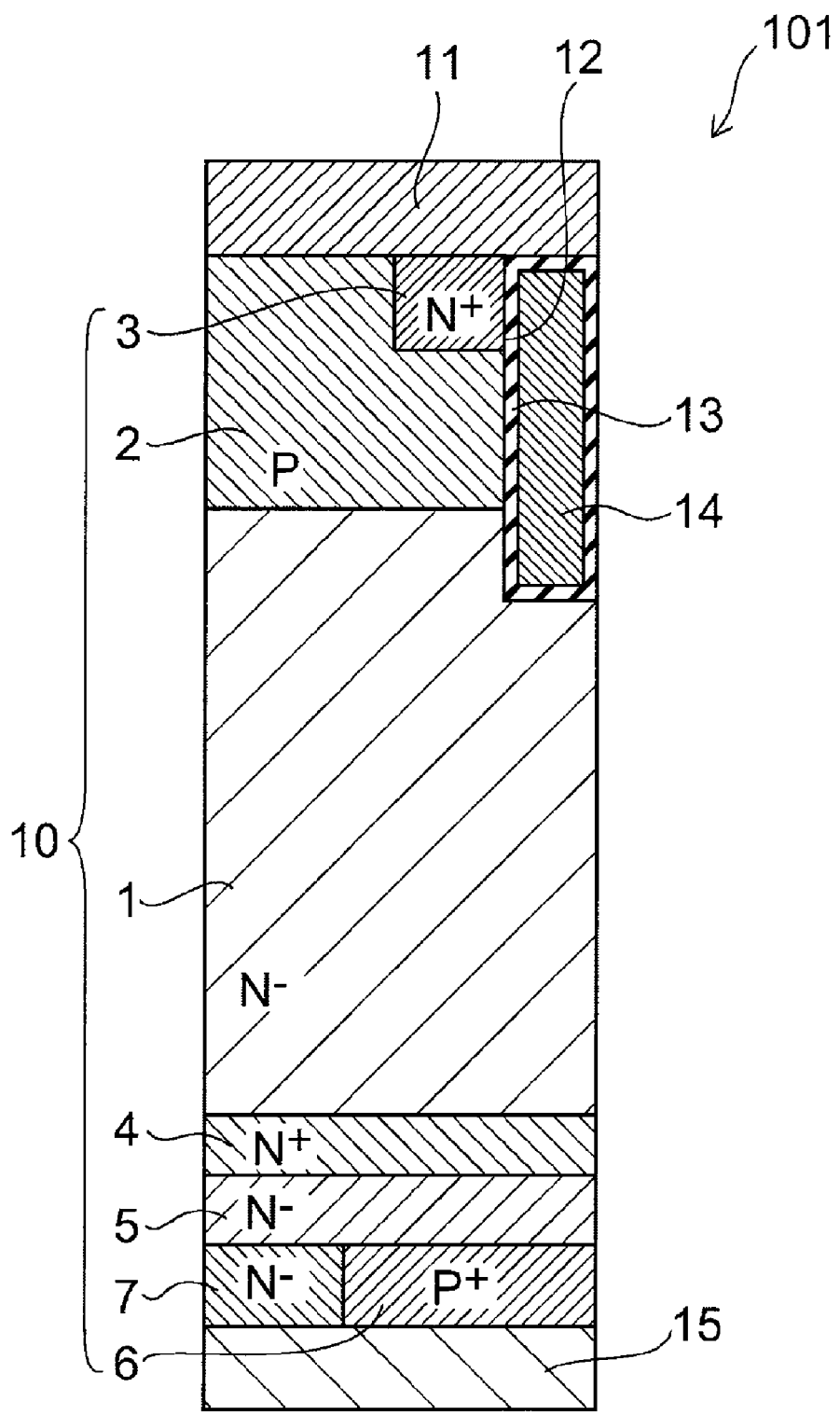
FIG. 1 is a cross-sectional view illustrating a semiconductor device according to a first embodiment of the invention.

FIG. 1 is a cross-sectional view illustrating a semiconductor device according to this embodiment.

The semiconductor device according to this embodiment is an anode-shorted IGBT.

As shown in FIG. 1, the semiconductor device 101 according to this embodiment includes an N-type drift layer 1 having $N^-$-type conductivity. A P-type base layer 2 having P-type conductivity is provided on the N-type drift layer 1, and an N-type emitter layer 3 having $N^+$-type conductivity is provided in part of an upper portion of the P-type base layer 2. For instance, the emitter layer 3 extends like a strip along the direction perpendicular to the page of FIG. 1.

On the other hand, an N-type buffer layer 4 having $N^+$-type conductivity is provided below the N-type drift layer 1. The N-type buffer layer 4 has a higher effective impurity concentration than the N-type drift layer 1. Here, the "effective impurity concentration" refers to the concentration of impurities contributing to electrical conduction in which donors and acceptors canceling each other out are excluded from the total impurities.

An N-type high-resistance layer 5 having $N^-$-type conductivity is provided below the N-type buffer layer 4. The donor concentration (N-type impurity concentration) of the N-type high-resistance layer 5 is lower than the donor concentration of the N-type buffer layer 4, and the N-type high-resistance layer 5 and the N-type buffer layer 4 do not substantially contain acceptors. Hence, the N-type high-resistance layer 5 has a lower effective impurity concentration than the N-type buffer layer 4. Thus, the N-type high-resistance layer 5 has a higher resistivity than the N-type buffer layer 4.

A P-type collector layer 6 having $P^+$-type conductivity is provided in a partial region on the lower surface of the N-type high-resistance layer 5, and an N-type contact layer 7 having $N^-$-type conductivity is provided in the remaining region on the lower surface of the N-type high-resistance layer 5. The P-type collector layer 6 and the N-type contact layer 7 are arranged alternately along a direction parallel to the lower surface of the high-resistance layer 5, and are in contact with each other. Thus, the N-type buffer layer 4 is interposed between the N-type drift layer 1 and the P-type collector layer 6. Furthermore, the N-type high-resistance layer 5 is placed continuously from immediately above the P-type collector layer 6 to immediately above the N-type contact layer 7. In this embodiment, the N-type high-resistance layer 5 and the N-type contact layer 7 have no substantial difference in donor concentration and acceptor concentration, as well as in crystal defect density and other properties, and are continuously formed.

The N-type drift layer 1, P-type base layer 2, N-type emitter layer 3, N-type buffer layer 4, N-type high-resistance layer 5, P-type collector layer 6, and N-type contact layer 7 constitute a semiconductor chip 10. The semiconductor chip 10 is entirely formed from a single crystal semiconductor material, such as single crystal silicon.

An emitter electrode 11 made of a metal is provided on the upper surface of the semiconductor chip 10. The emitter electrode 11 is in contact with the upper surface of the P-type base layer 2 and the upper surface of the N-type emitter layer 3, and is connected to the P-type base layer 2 and the N-type emitter layer 3.

A plurality of trenches 12 are formed in an upper portion of the semiconductor chip 10 so as to extend from the upper surface of the N-type emitter layer 3 through the N-type emitter layer 3 and the P-type base layer 2 into the N-type drift layer 1. The trenches 12 are shaped like stripes extending in the direction perpendicular to the page of FIG. 1. In an example, the trench 12 has a depth of e.g. 5 microns (μm), an opening width of e.g. 1 micron (μm), and an arrangement pitch of e.g. 4 microns.

A gate insulating film 13 is formed on the inner surface of the trench 12. In the case where the semiconductor chip 10 is formed from silicon, the gate insulating film 13 is illustratively formed from silicon oxide. A conductive material, such as polysilicon provided with conductivity by impurity doping, is buried inside the trench 12, thereby forming a trench gate electrode 14.

Thus, the trench gate electrode 14 penetrates through the N-type emitter layer 3 and the P-type base layer 2 and extends into the N-type drift layer 1. The gate insulating film 13 is located between the N-type emitter layer 3, P-type base layer 2, N-type drift layer 1, and emitter electrode 11 on one hand and the trench gate electrode 14 on the other, and insulates the trench gate electrode 14 from the N-type emitter layer 3, P-type base layer 2, N-type drift layer 1, and emitter electrode 11. Furthermore, the trench gate electrode 14 is provided in a plurality, which extend like stripes along the direction perpendicular to the page of FIG. 1.

A collector electrode 15 made of a metal is provided on the lower surface of the semiconductor chip 10. The collector electrode 15 is in contact with the lower surface of the P-type collector layer 6 and the lower surface of the N-type contact layer 7, and is connected to the P-type collector layer 6 and the N-type contact layer 7.

The three-layer structure composed of the N-type drift layer 1, the N-type buffer layer 4, and the N-type high-resistance layer 5 can be fabricated illustratively by epitaxially growing an $N^+$-type semiconductor layer on an $N^-$-type semiconductor substrate serving as the N-type drift layer 1 to form the N-type buffer layer 4, followed by epitaxially growing an $N^-$-type semiconductor layer to form the N-type high-resistance layer 5.

Alternatively, the three-layer structure composed of the N-type drift layer 1, the N-type buffer layer 4, and the N-type high-resistance layer 5 may be fabricated by ion-implanting donor impurities into an $N^-$-type semiconductor substrate and activating them to form the N-type buffer layer 4 in this semiconductor substrate. In this case, $N^-$-type portions of the semiconductor substrate separated by the N-type buffer layer 4 constitute the N-type drift layer 1 and the N-type high-resistance layer 5.

Next, the operation of this embodiment is described.

Figure 2:
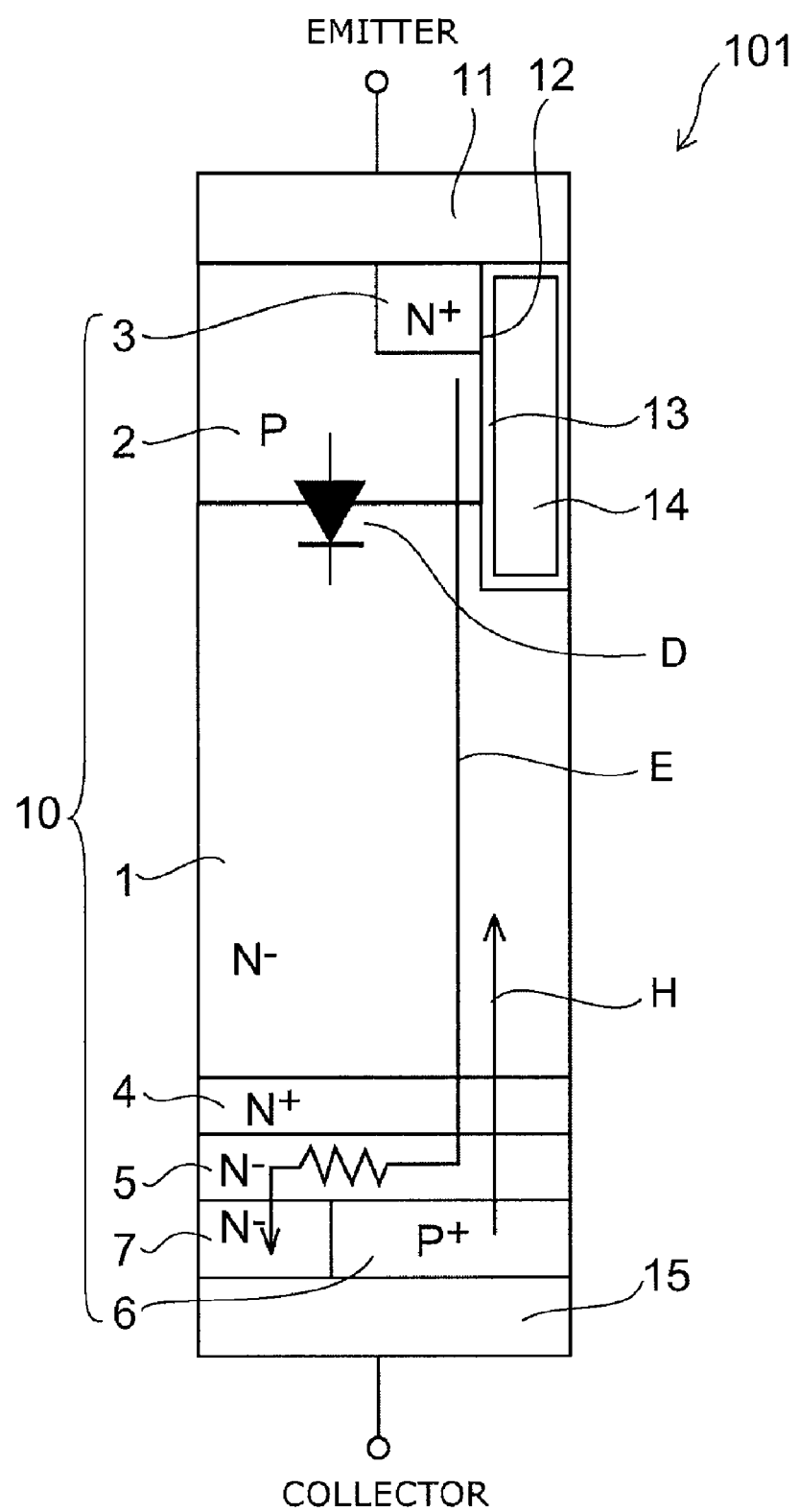
FIG. 2 is a schematic cross-sectional view illustrating the operation of the semiconductor device according to the first embodiment.

FIG. 2 is a schematic cross-sectional view illustrating the operation of the semiconductor device according to this embodiment.

As shown in FIG. 2, with a negative potential applied to the emitter electrode 11 and a positive potential applied to the collector electrode 15, a positive potential is applied to the trench gate electrode 14. Then, an inversion layer (not shown) is formed in a region of the P-type base layer 2 in contact with the gate insulating film 13, and an electron current E flows through the P-type base layer 2 between the N-type emitter layer 3 and the N-type drift layer 1. This electron current E flows from the emitter electrode 11 through the N-type emitter layer 3, P-type base layer 2, N-type drift layer 1, N-type buffer layer 4, and N-type high-resistance layer 5 into the N-type contact layer 7 and flows out to the collector electrode 15. On the other hand, a hole current H flows from the collector electrode 15 through the P-type collector layer 6 into the semiconductor chip 10, and flows toward the emitter electrode 11. Part of the electron current E and part of the hole current H pair-annihilate in the semiconductor chip 10.

Here, in the semiconductor device 101, the N-type high-resistance layer 5 is placed continuously from immediately above the P-type collector layer 6 to immediately above the N-type contact layer 7. Hence, in the N-type high-resistance layer 5, the electron current E flows laterally from immediately above the P-type collector layer 6 to immediately above the N-type contact layer 7. This increases the voltage drop associated with this laterally flowing electron current E. Consequently, the potential of the P-type collector layer 6 easily becomes high, and Bias of the pn interface between the P-type collector layer 6 and the N-type high-resistance layer 5 is easily carried out to the forward direction. This facilitates hole injection from the P-type collector layer 6, allowing the semiconductor device 101 to be easily turned on.

On the other hand, if a negative potential is applied to the trench gate electrode 14, the inversion layer in the P-type base layer 2 vanishes, and no current flows in the P-type base layer 2. Thus, a depletion layer expands upward and downward from the interface between the P-type base layer 2 and the N-type drift layer 1. Here, in the semiconductor device 101, the N-type buffer layer 4 having high impurity concentration is interposed between the drift layer 1 and the P-type collector layer 6. Hence, the expansion of the depletion layer is blocked by the N-type buffer layer 4, and the depletion layer does not easily reach the P-type collector layer 6. This prevents punch-through between the P-type base layer 2 and the P-type collector layer 6, achieving high breakdown voltage.

In contrast, if the semiconductor device includes no N-type high-resistance layer 5, the lateral electron current flows in the N-type buffer layer 4. However, because the N-type buffer layer 4 has low resistivity, the voltage drop therein is insufficient. Hence, the potential of the P-type collector layer 6 cannot be sufficiently increased, and the semiconductor device is difficult to turn on. Furthermore, if the resistivity of the N-type buffer layer 4 is increased by decreasing its impurity concentration to obtain a sufficient voltage drop, the depletion layer easily reaches the P-type collector layer 6 in the OFF state, decreasing the breakdown voltage. Thus, a trade-off unfortunately occurs between the stability of the ON state and the breakdown voltage.

According to this embodiment, the N-type high-resistance layer 5 is provided in addition to the N-type buffer layer 4. Thus, the impurity concentration of the N-type buffer layer 4 can be increased while a sufficient voltage drop associated with the electron current is ensured by the N-type high-resistance layer 5. Thus, this embodiment can realize an anode-shorted IGBT which is easily turned on while ensuring a sufficient breakdown voltage.

Furthermore, according to this embodiment, a PN diode D composed of the P-type base layer 2 and the N-type drift layer 1 can be formed between the emitter electrode 11 and the collector electrode 15. That is, a diode can be included in the semiconductor device 101. This built-in diode can be used as a circuit element and serves to significantly decrease the number of elements in the circuit which includes the semiconductor device 101. Consequently, the cost of the circuit can be reduced.

Next, a second embodiment of the invention is described.

Figure 3:
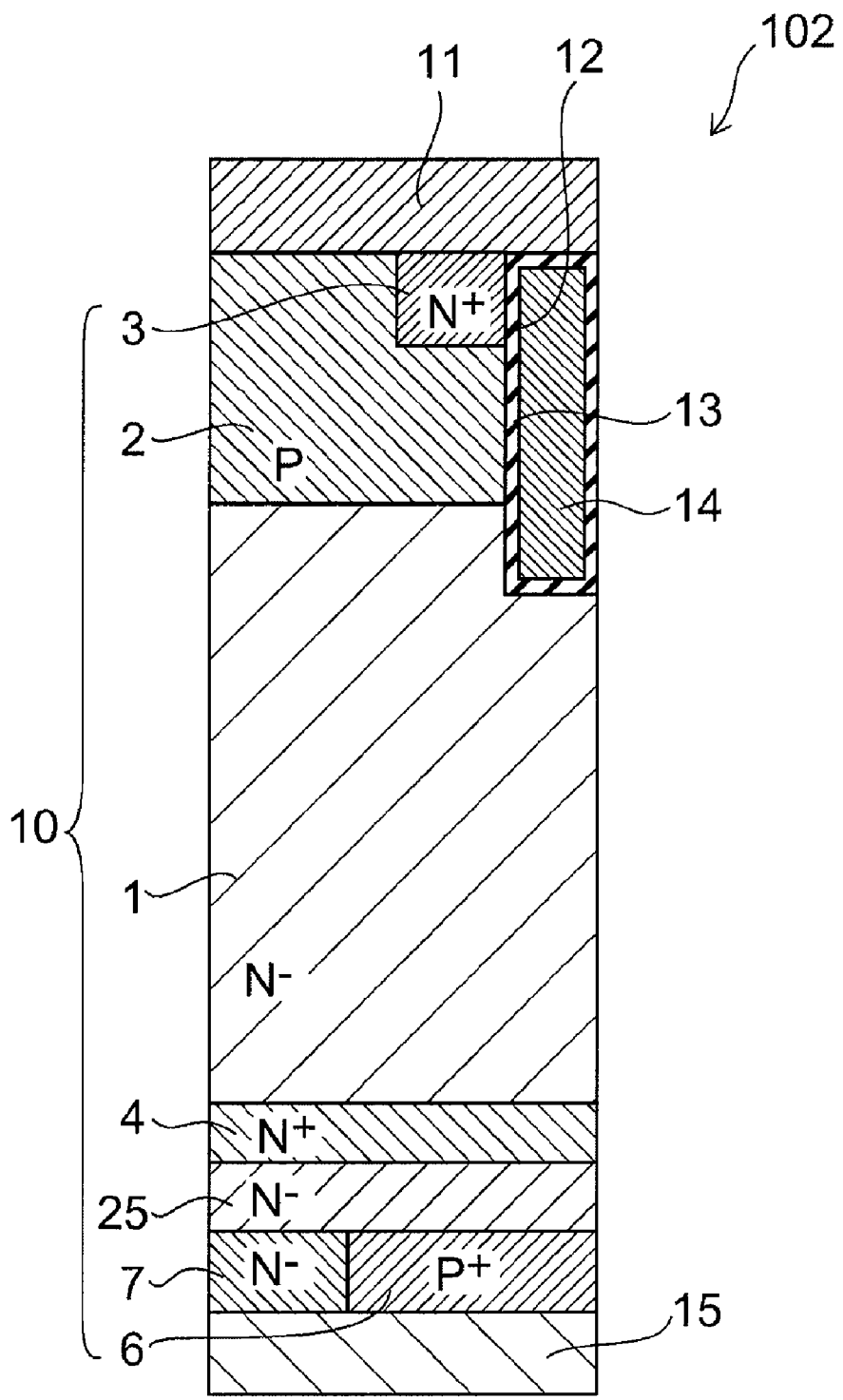
FIG. 3 is a cross-sectional view illustrating a semiconductor device according to a second embodiment of the invention.

FIG. 3 is a cross-sectional view illustrating a semiconductor device according to this embodiment.

As shown in FIG. 3, the semiconductor device 102 according to this embodiment includes an N-type high-resistance layer 25 instead of the N-type high-resistance layer 5 (see FIG. 1) of the semiconductor device 101 according to the above first embodiment. The donor concentration (N-type impurity concentration) of the N-type high-resistance layer 25 is nearly equal to the donor concentration of the N-type buffer layer 4, but the acceptor concentration (P-type impurity concentration) of the N-type high-resistance layer 25 is higher than the acceptor concentration of the N-type buffer layer 4. However, the acceptor concentration of the N-type high-resistance layer 25 is lower than the donor concentration of the N-type high-resistance layer 25. Hence, the N-type high-resistance layer 25 has a lower effective impurity concentration than the N-type buffer layer 4. Thus, the N-type high-resistance layer 25 has a higher resistivity than the N-type buffer layer 4.

The N-type high-resistance layer 25 can be formed by ion-implanting acceptors (second-conductivity-type impurities) into the lower surface of the N-type semiconductor substrate (semiconductor substrate of the first conductivity type) and activating them to cancel part of the donors contained in part of the N-type buffer layer 4. Here, the implantation amount of acceptors, $Q_p$, is such that the conductivity type of the N-type high-resistance layer 25 doped with acceptors remains to be N-type, and is not changed to P-type. That is, $Q_p < N_{buff} \times t$, where $N_{buff}$ is the donor concentration of the N-type buffer layer 4, and t is the thickness of the N-type high-resistance region 25 to be formed. The configuration of this embodiment other than the foregoing is the same as that of the above first embodiment. This embodiment can also achieve operation and effect similar to those of the above first embodiment.

Next, a third embodiment of the invention is described.

Figure 4:
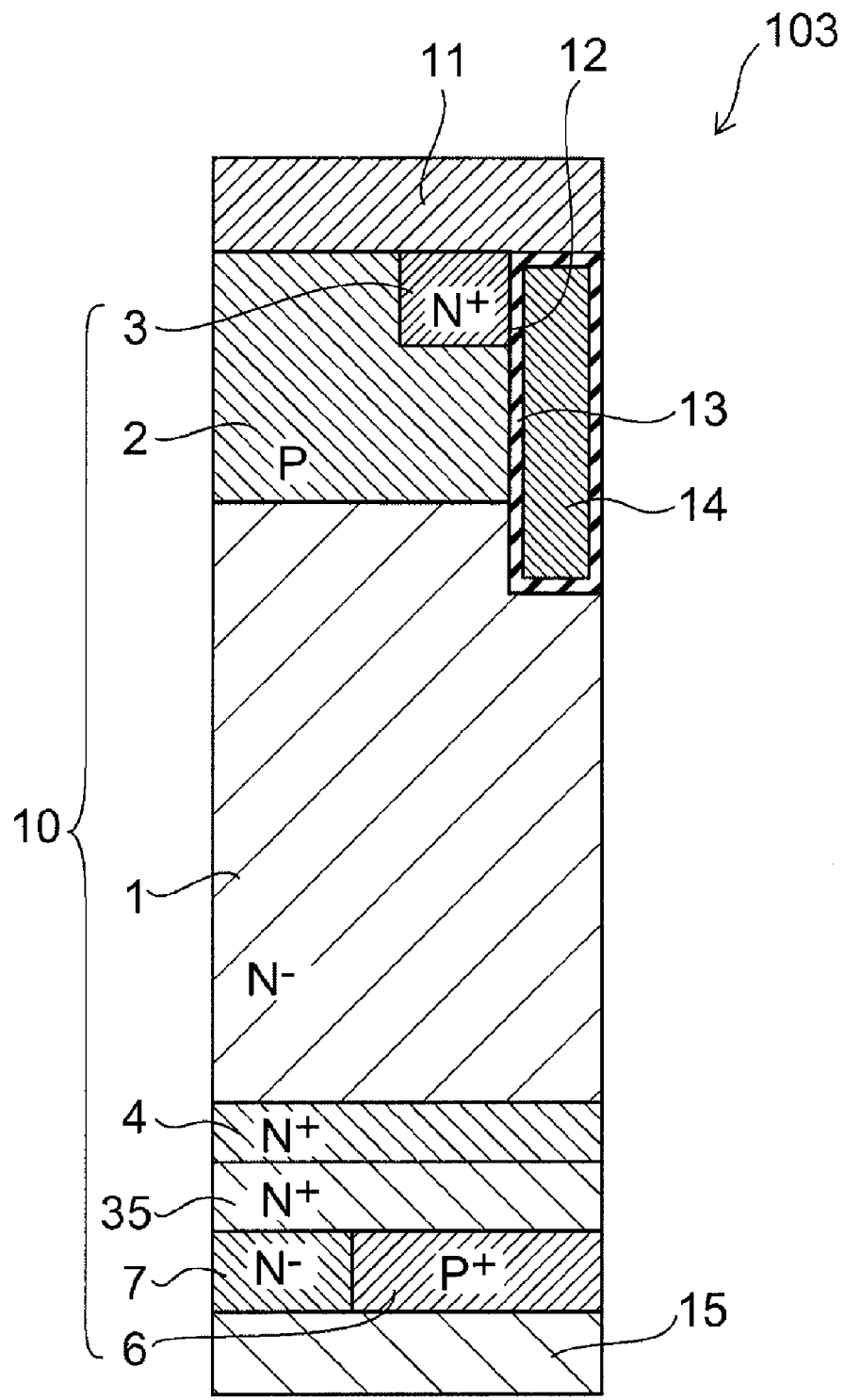
FIG. 4 is a cross-sectional view illustrating a semiconductor device according to a third embodiment of the invention.

FIG. 4 is a cross-sectional view illustrating a semiconductor device according to this embodiment.

As shown in FIG. 4, the semiconductor device 103 according to this embodiment includes an N-type high-resistance layer 35 having $N^+$-type conductivity instead of the N-type high-resistance layer 5 (see FIG. 1) of the semiconductor device 101 according to the above first embodiment. The donor concentration of the N-type high-resistance layer 35 is nearly equal to that of the N-type buffer layer 4, and the N-type high-resistance layer 35 and the N-type buffer layer 4 do not substantially contain acceptors. Hence, the effective impurity concentration of the N-type high-resistance layer 35 is nearly equal to that of the N-type buffer layer 4. However, the crystal defect concentration of the N-type high-resistance layer 35 is higher than that of the N-type buffer layer 4. Thus, the N-type high-resistance layer 35 has a higher resistivity than the N-type buffer layer 4. Furthermore, the argon (Ar) concentration in the N-type high-resistance layer 35 is higher than that in the N-type buffer layer 4.

The N-type high-resistance layer 35 can be formed by ion-implanting inert elements or other species, such as argon, into the lower surface of the semiconductor substrate to introduce crystal defects into part of the N-type buffer layer 4.

Here, no heat treatment for activating impurities is performed. The configuration of this embodiment other than the foregoing is the same as that of the above first embodiment. This embodiment can also achieve operation and effect similar to those of the above first embodiment. It is noted that in this embodiment, elements other than argon may be used as an inert element. For example, a rare gas element, for example, helium (He), neon (Ne), krypton (Kr), or Xenon (Xe) may be used. For example, the N-type high-resistance layer 35 may be formed by implanting helium (He) instead of argon.

Next, a fourth embodiment of the invention is described.

Figure 5:
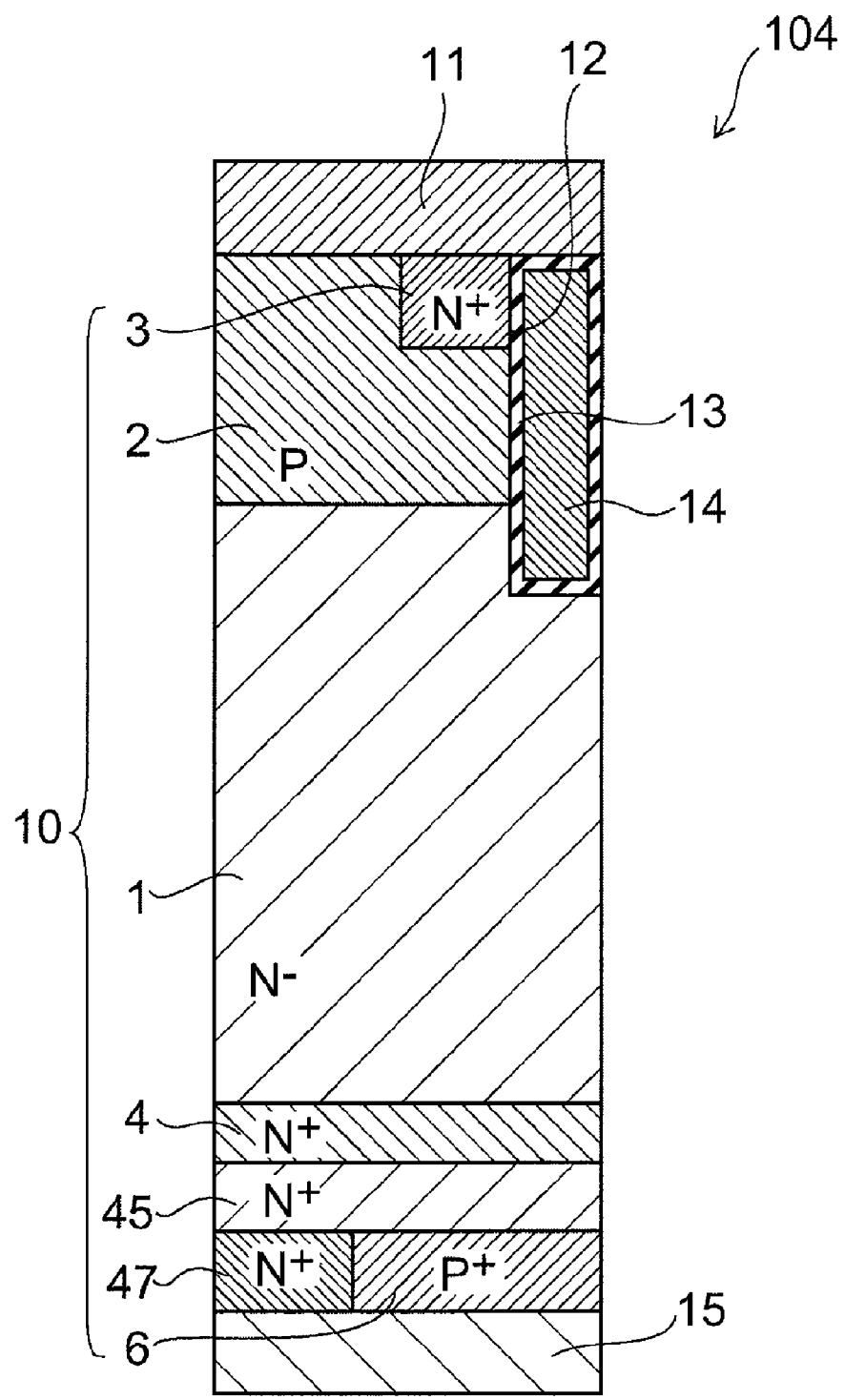
FIG. 5 is a cross-sectional view illustrating a semiconductor device according to a fourth embodiment of the invention.

FIG. 5 is a cross-sectional view illustrating a semiconductor device according to this embodiment.

As shown in FIG. 5, the semiconductor device 104 according to this embodiment includes an N-type high-resistance layer 45 instead of the N-type high-resistance layer 5 (see FIG. 1) of the semiconductor device 101 according to the above first embodiment. Like the N-type high-resistance layer 35 (see FIG. 4) in the above third embodiment, the donor concentration and acceptor concentration of the N-type high-resistance layer 45 are also nearly equal to those of the N-type buffer layer 4, and hence the effective impurity concentration of the N-type high-resistance layer 45 is also nearly equal to that of the N-type buffer layer 4. On the other hand, the crystal defect concentration of the N-type high-resistance layer 45 is higher than that of the N-type buffer layer 4. Thus, the N-type high-resistance layer 45 has a higher resistivity than the N-type buffer layer 4. Furthermore, this embodiment includes an N-type contact layer 47 instead of the N-type contact layer 7 (see FIG. 1) of the semiconductor device 101 according to the above first embodiment. The N-type contact layer 47 has $N^+$-type conductivity.

The semiconductor device 104 can be manufactured by processing the lower surface of the semiconductor substrate to form a fracture layer, and forming a semiconductor layer thereon illustratively by epitaxial growth. Here, numerous crystal defects are introduced into the fracture layer, which thus serves as the N-type high-resistance layer 45. Because the semiconductor layer formed on the fracture layer contains few crystal defects, the P-type collector layer 6 and the N-type contact layer 47 are formed on this semiconductor layer. The configuration of this embodiment other than the foregoing is the same as that of the above first embodiment. This embodiment can also achieve operation and effect similar to those of the above first embodiment.

The invention has been described with reference to the embodiments. However, the invention is not limited to these embodiments. The above embodiments can be practiced in combination with each other. Furthermore, those skilled in the art can suitably modify the above embodiments by addition, deletion, or design change of components, or by addition, omission, or condition change of processes, and such modifications are also encompassed within the scope of the invention as long as they fall within the spirit of the invention.

The invention claimed is:

1. A semiconductor device comprising:
   a drift layer of a first conductivity type;
   a base layer of a second conductivity type provided on the drift layer;
   an emitter layer of the first conductivity type provided in part of an upper portion of the base layer;
   a buffer layer of the first conductivity type provided below the drift layer and having a higher effective impurity concentration than the drift layer;

a high-resistance layer of the first conductivity type provided below the buffer layer and having a higher resistivity than the buffer layer;

a collector layer of the second conductivity type provided in a partial region on a lower surface of the high-resistance layer;

a contact layer of the first conductivity type provided in another partial region on the lower surface of the high-resistance layer;

an emitter electrode connected to the base layer and the emitter layer;

a trench gate electrode extending through the emitter layer and the base layer into the drift layer;

a gate insulating film provided between the emitter layer, the base layer, and the drift layer on one hand and the trench gate electrode on the other; and a collector electrode connected to the collector layer and the contact layer.

2. The semiconductor device according to claim 1, wherein the collector layer and the contact layer are arranged alternately along a direction parallel to the lower surface of the high-resistance layer.

3. The semiconductor device according to claim 1, wherein
the emitter layer is shaped like a strip extending in one direction, and
the trench gate electrode is shaped like a stripe extending in the one direction.

4. The semiconductor device according to claim 1 wherein a concentration of an inert element in the high-resistance layer is higher than a concentration of an inert element in the buffer layer.

5. The semiconductor device according to claim 4, wherein the inert element is a rare gas element.

6. The semiconductor device according to claim 1, wherein crystal defect density of the high-resistance layer is higher than crystal defect density of the buffer layer.

7. The semiconductor device according to claim 6, wherein the high-resistance layer is formed by implanting the inert element into a semiconductor substrate to introduce crystal defects.

8. The semiconductor device according to claim 7, wherein the inert element is a rare gas element.

9. The semiconductor device according to claim 6, wherein the high-resistance layer is formed by processing a surface of a semiconductor substrate to form a fracture layer, and the collector layer and the contact layer are formed by epitaxially growing a semiconductor layer on the fracture layer.

10. The semiconductor device according to claim 1, wherein an effective impurity concentration of the high-resistance layer is lower than the effective impurity concentration of the buffer layer.

11. The semiconductor device according to claim 10, wherein a concentration of first-conductivity-type impurities in the high-resistance layer is lower than a concentration of first-conductivity-type impurities in the buffer layer.

12. The semiconductor device according to claim 11, wherein
the buffer layer is formed by epitaxially growing a semiconductor layer of the first conductivity type on the drift layer, and
the high-resistance layer is formed by epitaxially growing a semiconductor layer of the first conductivity type on the buffer layer.

13. The semiconductor device according to claim 11, wherein a three-layer structure composed of the drift layer, the buffer layer, and the high-resistance layer is fabricated by implanting impurities into a semiconductor substrate of the first conductivity type and activating the impurities to form the buffer layer in the semiconductor substrate.

14. The semiconductor device according to claim 10, wherein a concentration of second-conductivity-type impurities in the high-resistance layer is higher than a concentration of second-conductivity-type impurities in the buffer layer.

15. The semiconductor device according to claim 14, wherein the high-resistance layer is formed by implanting the second-conductivity-type impurities into a semiconductor substrate of the first conductivity type.

16. The semiconductor device according to claim 15, wherein a formula $$Q_p < N_{buff} \times t$$

is satisfied, where $Q_p$ is implantation amount of the second-conductivity-type impurities, $N_{buff}$ is a concentration of first-conductivity-type impurities in the buffer layer, and t is thickness of the high-resistance layer.

* * * * *